United States Patent
Doering et al.

(10) Patent No.: US 9,496,006 B2
(45) Date of Patent: Nov. 15, 2016

(54) MEMORY MODULE AND MEMORY CONTROLLER FOR CONTROLLING A MEMORY MODULE

(71) Applicant: GLOBALFOUNDRIES INC., Grand Cayman (KY)

(72) Inventors: Andreas C Doering, Zufikon (CH); Patricia M Sagmeister, Adliswil (CH); Martin L Schmatz, Zurich (CH)

(73) Assignee: GLOBALFOUNDRIES INC., Grand Cayman (KY)

( * ) Notice: Subject to any disclaimer, the term of this patent is extended or adjusted under 35 U.S.C. 154(b) by 270 days.

(21) Appl. No.: 13/672,751

(22) Filed: Nov. 9, 2012

(65) Prior Publication Data
US 2013/0124786 A1    May 16, 2013

(30) Foreign Application Priority Data

Nov. 11, 2011  (EP) ..................... 11188806

(51) Int. Cl.
*G06F 12/00* (2006.01)
*G11C 5/06* (2006.01)
*G11C 5/04* (2006.01)
*G06F 3/06* (2006.01)

(52) U.S. Cl.
CPC . *G11C 5/04* (2013.01); *G06F 3/06* (2013.01); *G06F 12/00* (2013.01)

(58) Field of Classification Search
CPC ............................... G11C 5/04; G06F 13/161
USPC ........................................................ 711/103
See application file for complete search history.

(56) References Cited

U.S. PATENT DOCUMENTS

| 5,272,664 | A | 12/1993 | Alexander et al. |
| 6,705,877 | B1 | 3/2004 | Li et al. |
| 7,739,441 | B1 | 6/2010 | Lee et al. |
| 8,260,973 | B2* | 9/2012 | Asnaashari ........... G06F 13/161 710/33 |
| 8,321,627 | B1* | 11/2012 | Norrie .................. G06F 13/161 365/185.33 |
| 8,335,894 | B1* | 12/2012 | Rajan ..................... G06F 12/00 711/154 |
| 2010/0005281 | A1 | 1/2010 | Buchmann et al. |
| 2010/0036997 | A1 | 2/2010 | Brewer et al. |
| 2010/0157644 | A1* | 6/2010 | Norman ........................ 365/51 |
| 2010/0262790 | A1 | 10/2010 | Perego et al. |
| 2010/0293325 | A1 | 11/2010 | Maheshwari |
| 2011/0145504 | A1* | 6/2011 | Anh ..................... G06F 13/1684 711/129 |
| 2011/0164618 | A1* | 7/2011 | Sindhu .................... H04L 12/56 370/392 |
| 2012/0317352 | A1* | 12/2012 | Kang ................. G11C 11/40611 711/106 |
| 2014/0208156 | A1* | 7/2014 | Muralimanohar ....... G11C 5/04 714/6.24 |

OTHER PUBLICATIONS

M. Awasthi et al. "Handling the problems and opportunities posed by multiple on-chip memory controllers", PACT'10, Vienna, Austria, ACM 978-1-4503-0178-7/10/09.
F. Cabarcas et al. "Interleaving granularity in high bandwidth memory architecture for CMPs", IEEE, 978-1-4244-7938-2/10.

* cited by examiner

*Primary Examiner* — David X Yi
*Assistant Examiner* — Zubair Ahmed
(74) *Attorney, Agent, or Firm* — Michael LeStrange; Hoffman Warnick LLC (57) ABSTRACT

The memory module having a plurality of memory chips and a plurality of connections for connecting the memory module to a processor. At least part of the connections is configurable to be grouped into N sets of address and control connections for N separatively controllable groups of memory chips of the plurality of memory chips (N≥2).

20 Claims, 8 Drawing Sheets

MEMORY MODULE AND MEMORY CONTROLLER FOR CONTROLLING A MEMORY MODULE

CROSS-REFERENCE TO RELATED APPLICATION

This application claims priority under 35 U.S.C. §119 from European Patent Application No. 11188806.1 filed Nov. 11, 2011, the entire contents of which are incorporated herein by reference.

BACKGROUND OF THE INVENTION

1. Field of the Invention

The invention relates to a memory module and to a memory controller for controlling a memory module. Further, the invention relates to method for controlling a memory module having a plurality of memory chips and a plurality of connections.

2. Description of Related Art

Memory or computer memory, e.g. based on DRAM technology, can be built in the form of Dual Inline Memory Modules (DIMM). Such a DIMM includes a number of memory chips on a printed circuit board and is plugged into the main board of the computer. The number of connections or connector contacts from the DIMM to the main board is limited by mechanical and reliability issues.

Over time, the memory capacity has grown. A conventional DIMM containing 1 GB of memory has 64 bidirectional data connections, 14 multiplexed address connections and additional connections for clock, status, power and the like. For other markets, such as servers, the format and connector assignments can be different. Since the market for memory is very large, changing the format, including the mechanical dimensions, connector density or type, can be difficult.

Depending on a current application, a computer needs to access memory in different granularity. While some applications read and write entire cash lines of 64 bytes or 128 bytes, other applications can need less data from each address.

However, the pin-out of conventional DIMM fixes the ratio of address transfers and data transfers and hence the optimal granularity. If data is accessed with lower granularity, the data throughput will decrease, because the access rate is limited by the address wires.

U.S. Pat. No. 2010/0036997 A1, a multiple data channel memory module architecture is described. U.S. Pat. No. 2010/0262790 A1 shows memory controllers, methods, and systems supporting multiple memory modes. In U.S. Pat. No. 2010/0293325 A1, memory devices and systems including multi-speed access of memory modules are described. Reference U.S. Pat. No. 6,705,877 B1 shows stackable memory module with variable bandwidth. In U.S. Pat. No. 7,739,441 B1, communicating between a native fully buffered dual in-line memory module protocol and a double data rate synchronous dynamic random access memory protocol is described M. Awasthi et al. "Handling the problems and opportunities posed by multiple on-chip memory controllers", PACT'10, Vienna, Austria, ACM 978-1-4503-0178-7/10/09 mentions a solution for handling the problems and opportunities posed by multiple on-chip memory controllers. In F. Cabarcas et al. "Interleaving granularity on high bandwidth memory architecture for CMPs", IEEE, 978-1-4244-7938-2/10 interleaving granularity on high bandwidth memory architecture for CMPs is described.

Accordingly, it is an aspect of the present invention to provide a memory module with a configurable ratio of address transfers and data transfers.

SUMMARY OF THE INVENTION

In one aspect of the invention, a memory module is provided. The memory module includes a plurality of memory chips, a plurality of connections for connecting the memory module to a processor, wherein a part of the connections is configurable to be grouped into N sets of address and control connections for N separatively controllable groups of memory chips of the plurality of memory chips, N≥2.

In a second aspect of the invention, a memory controller for controlling a memory module having a plurality of memory chips and a plurality of connections for connecting the memory module to a processor is provided. The memory controller includes a configurator for configuring the memory module such that a part of the connections is grouped into N sets of address and control connections for N separatively controllable groups of memory chips of the plurality of memory chips, N≥2.

BRIEF DESCRIPTION OF THE DRAWINGS

Similar or functionally similar elements in the figures have been allocated the same reference signs if not otherwise indicated.

DETAILED DESCRIPTION OF THE PREFERRED EMBODIMENTS

The memory module has a plurality of memory chips and a plurality of connections for connecting the memory module to a processor. At least a part of the connections is configurable to be grouped into N sets of address and control connections for N separatively controllable groups of memory chips of the plurality of memory chips (N≥2).

According to some implementations, the connector assignment can be modified in the present memory module, but the mechanical format and the electrical properties of the connections, in particular wires, between the memory chips and the memory controller controlling the memory module can be unchanged. Particularly, this allows building a memory module with a configurable ratio of address transfers and data transfers. Therefore, each customer can decide on its own how many large data granularity and how many lower data throughput, but higher data transaction rate he chooses. A memory chip can have a package of memory cells, in particular a matrix of memory cells. The connections can include connectors, connector contacts and/or wires.

For the example that N=2, a memory module format is proposed that uses two sets of address connections and half the number of data connections such that the data throughput is reduced, but the number of transactions is increased.

In an embodiment, said part of the connections is configurable such that each set of the N sets of address and control connections is connectable to a respective group of the N separate groups. Thus, each set of the N sets of address and control connections can be allocated to one group of the N separate groups.

In a further embodiment, the storage is configured to provide one selected set of the number of sets of configuration data to a memory controller for configuring the memory module by the selected configuration data.

In a further embodiment, the plurality of connections includes one data connection for each memory chip of the plurality of memory chips.

In a further embodiment, each set of configuration data includes a group indication, N member indications and N capacity indications. The group indication indicates the number N of groups. The N member indications include one member indication for each group, wherein the respective member indication indicates the memory chips of the respective group. The N capacity indications include one capacity indication for each group of the N groups, wherein the respective capacity indication indicates a capacity of the memory chips of the respective group.

Figure 1:
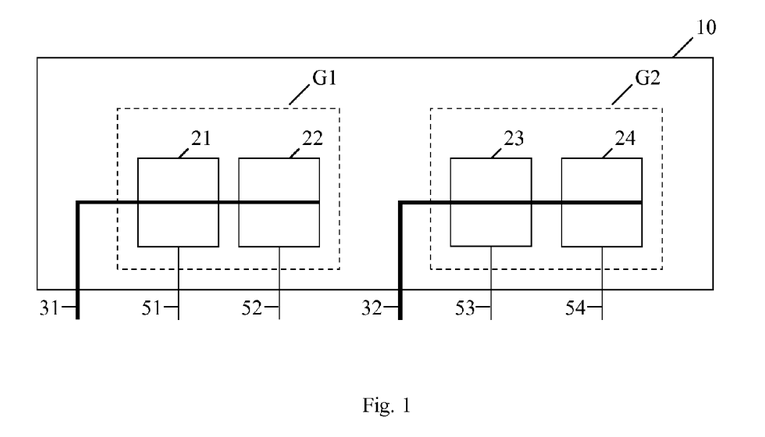
FIG. 1 shows a schematic block diagram of a first embodiment of a memory module.

In FIG. 1, a schematic block diagram of an embodiment of a memory module 10 is depicted. The memory module 10 has four memory chips 21-24. Further, the memory module 10 has a plurality of connections 31, 32, 51-54. The connections 31, 32, 51-54 are adapted to connect the memory module 10 to a processor (not shown). A part of the connections 31, 32, 51-55 is configurable to be grouped into two sets of address and control connections 31, 32 for two separatively controllable groups G1, G2 of memory chips 21-24. Each set of address and control connections 31, 32 can comprise a plurality of physical lines connectable to the processor or to an interface for interfacing with the processor.

Without loss of generality, the memory module 10 of FIG. 1 has four memory chips 21-24. Moreover, without loss of generality, the memory chips 21-24 are grouped into two groups G1, G2.

In the example of FIG. 1, a first set 31 of address and control connections 31 is connectable to a first group G1 including a first memory chip 21 and a second memory chip 22. Further, a second set 32 of address and control connections is connectable to a second group G2 including a third memory chip 23 and a fourth memory chip 24. Moreover, the plurality of connections 31, 32, 51-54 includes one data connection 51-54 for each memory chip 21-24 of the memory module 10. Thus, a first data connection 51 is provided for the first memory chip 21, for example. The memory module 10 can be embodied as a Dual In-line Memory Module (DIMM).

Figure 2:
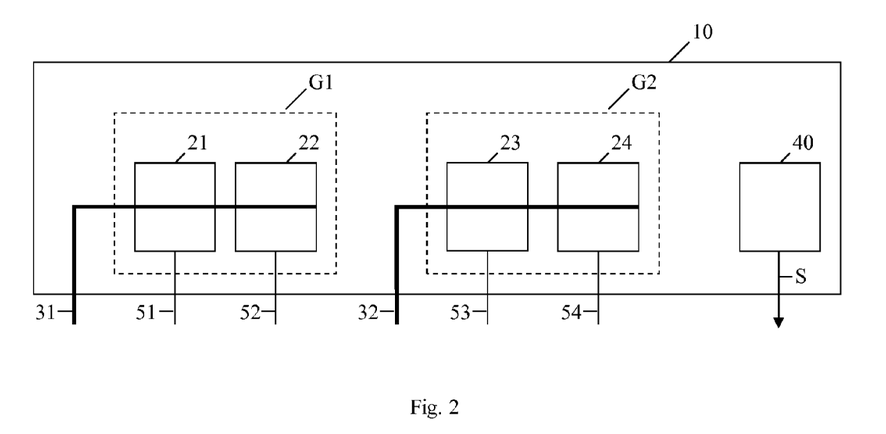
FIG. 2 shows a schematic block diagram of a second embodiment of a memory module.

FIG. 2 shows a schematic block diagram of a second embodiment of a memory module 10. The second embodiment of the memory module 10 includes all features of the memory module 10 of FIG. 1. Further, the memory module 10 of FIG. 2 comprises storage 40. The storage 40 can be embodied as EEPROM storage. The storage 40 is configured to provide a selected set S of configuration data for configuring the connections 31, 32, 51-54 from a number of sets S of configuration data.

Figure 3:
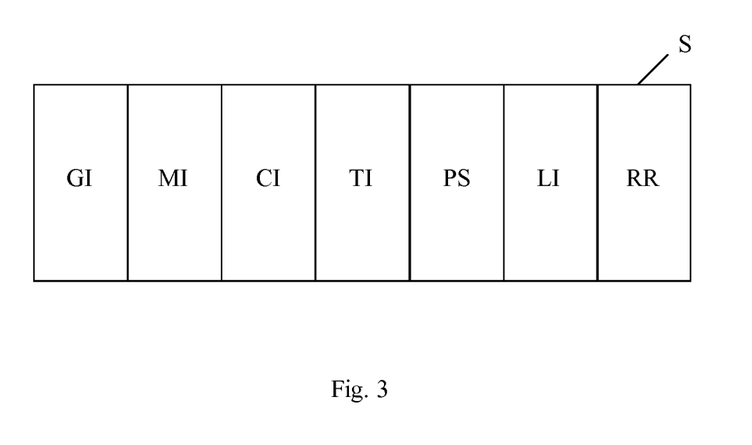
FIG. 3 shows a schematic block diagram of an embodiment of a configuration data set.

In this regard, FIG. 3 shows a schematic diagram of an embodiment of a configuration data set S. The configuration data set S includes a group indication GI, a member indication MI, a capacity indication CI, a timing information TI, a power supply information PS, a latency information LI and refreshment requirements RR.

For example, the group indication GI indicates the number N of groups, which is two for the example of FIGS. 1 and 2. The member indication MI indicates the members of memory chips 21-24 for each of the groups G1, G2. Thus, for the example of FIGS. 1 and 2, the member indication MI indicates that the first memory chip 21 and the second memory chip 22 are part of the first group G1, and the third memory chip 23 and the fourth memory chip 24 are part of the second group G2. The capacity indication CI indicates the capacity of the memory chips 21, 22; 23, 24 of the group G1; G2.

Figure 4:
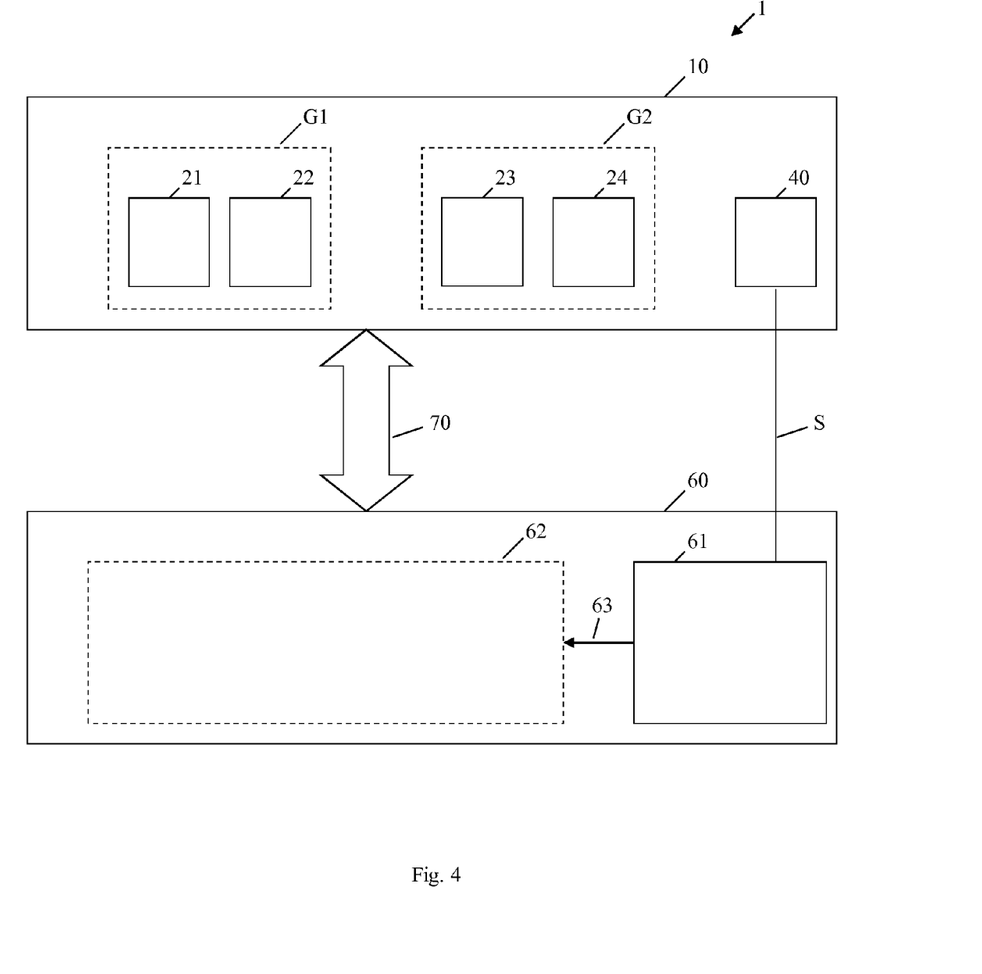
FIG. 4 shows a schematic block diagram of a first embodiment of a system having the memory module of FIG. 2 and a memory controller.

In FIG. 4, a schematic block diagram of the first embodiment of a system 1 having the memory module 10 of FIG. 2 and a memory controller 60 is depicted.

The memory controller 60 has a configurator 61 and schematically shown memory controller components 62, which are configured by the configurator 61 over a configuration interface 63. Details for the memory components 62 are given in FIG. 6.

The configurator 61 is adapted to configure the memory module 10 such that a part of the connections 31, 32, 51-54 is grouped into two sets of address and control connections 31, 32 for two separatively controllable groups G1, G2 of memory chips 21-24. The connections 31, 32, 51-54 are illustrated as a memory bus 70 in FIG. 4. The configurator 61 can configure the connections 31, 32, 51-54 of the memory bus 70 in dependence on a configuration data set S which is requested and received from the storage 40 of the memory module 10.

Figure 5:
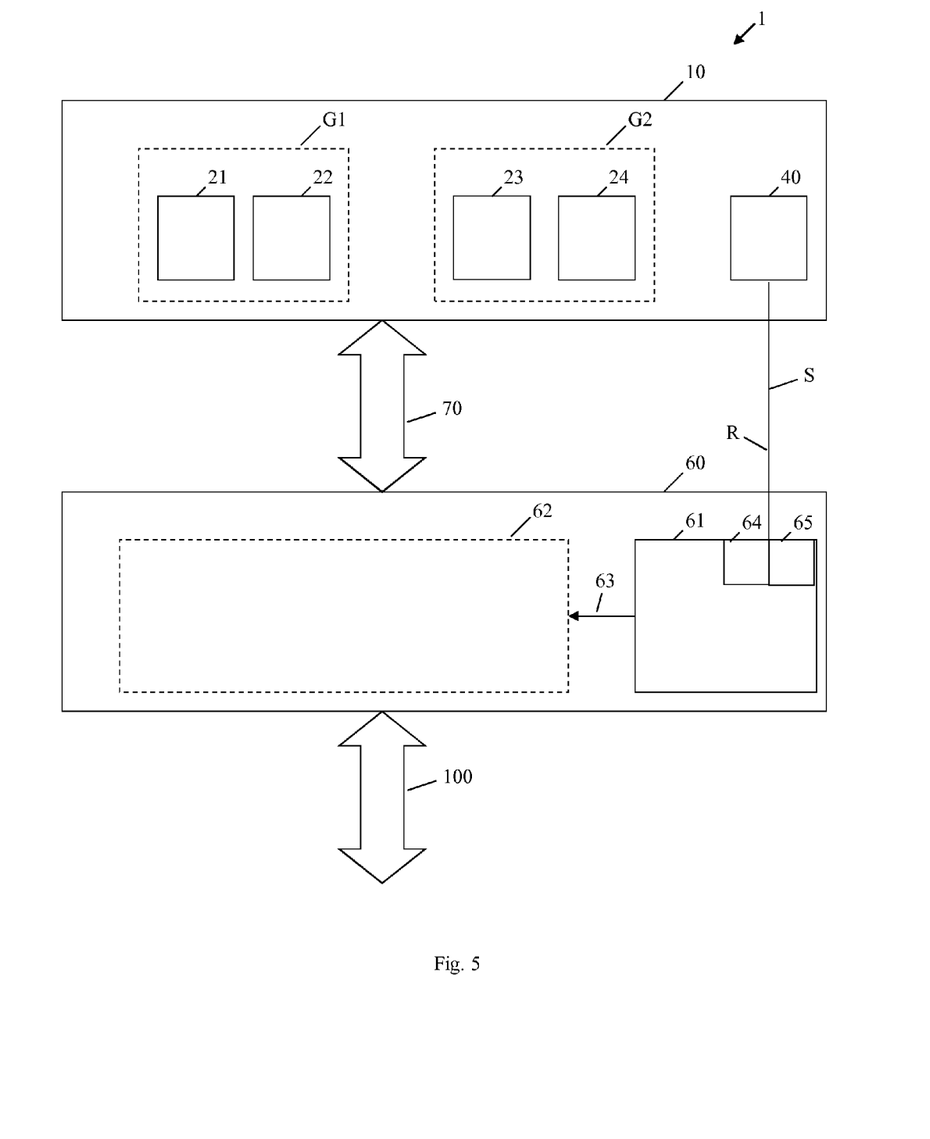
FIG. 5 shows a schematic block diagram of a second embodiment of a system having the memory module of FIG. 2 and a memory controller.

To illustrate this in more detail, FIG. 5 shows a schematic block diagram of a second embodiment of a system 1 having the memory module 10 of FIG. 2 and the memory controller 60. The configurator 61 of FIG. 5 has a receiver 64 and a selector 65.

The selector 65 is configured to transmit a request R to the storage 40 of the memory module 10 for selecting one set S of the stored configuration data sets. The storage 40 is adapted to provide the selected configuration data set S to the memory controller 60, in particular to the receiver 64. Then, the configurator 61 can be adapted to configure the plurality of connections of the memory bus 70 in dependence on the received configuration data set S.

Figure 6:
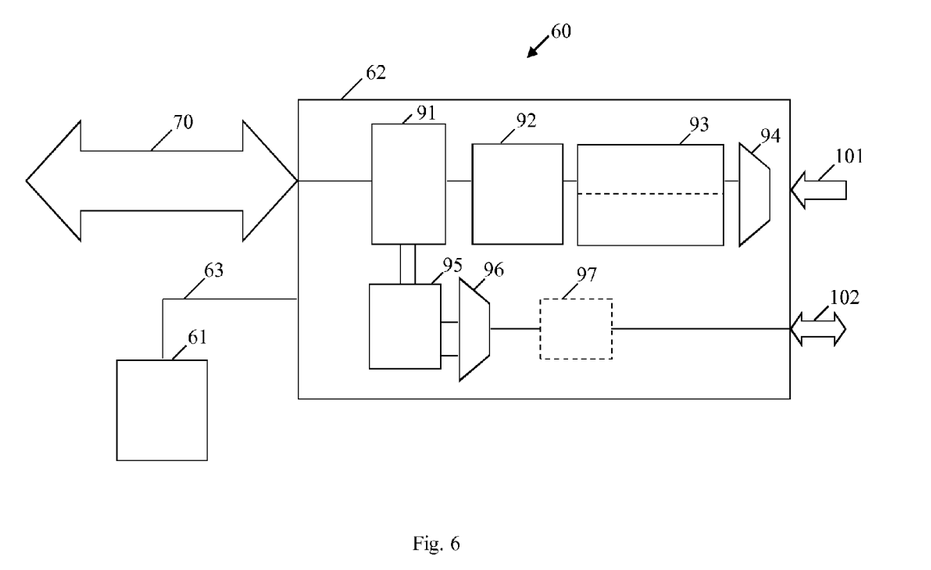
FIG. 6 shows a schematic block diagram of an embodiment of a memory controller.

Moreover, FIG. 6 shows a schematic block diagram of an embodiment of a memory controller 60 coupled to a memory module 10 (not shown in FIG. 6) by a memory bus 70 and to a processor (not shown in FIG. 6) by an address/control interface 101 and a data interface 102.

The memory controller 60 has the configurator 61 and a number of memory controller components 62. The memory controller components 62 and the configurator 61 can be coupled by means of the configuration interface 63. By means of the configuration interface 63, the configurator 61 can configure the memory controller components 62, in particular on the basis of the received configuration data set S as provided by the storage 40 of the memory module 10 (not shown).

The memory controller components 62 include a line driver 91, a memory protocol state machine scheduler 62, a command queue 93 and a multiplexer 94 coupled between the memory bus 70 and the address/control interface 101.

Further, the memory controller components 62 include a first data formatter 95, a second data formatter 96 and an Error Correcting Code (ECC) entity 97 coupled between the line driver 91 and the data interface 102. The line driver 91 is configured to drive the connections of the memory bus 70. The memory protocol state machine scheduler 92 is configured to control the line driver 91. The command queue 93 is adapted to input address and control data received over the address/control interface 101 and the multiplexer 94 for the memory protocol state machine scheduler 92.

The first data formatter 95 coupled between the line driver 91 and the second data formatter 96 is configured to format data to be transmitted between the memory module 10 and the processor within each group G1, G2 of the two separatively controllable groups G1, G2 of memory chips 21-24. The second data formatter 96 can include a data concentrator and a data splitter for formatting data between the separatively controllable groups G1, G2. The ECC 97 coupled between the second data formatter 96 and the data interface 102 can provide error correction.

The memory controller 60 can be part of a processor, network component, a graphics accelerator or the like. The interfaces 101 and 102 provide a connection for the memory controller to the rest of the system. Through this memory access interfaces 101, 102, the memory controller 60 can receive requests for memory accesses, and—if the request requires—data for this request. Further, the memory controller 60 can also provide results like signaling completion or providing resulting data, e.g. read data through these interfaces 101, 102.

Request information, such as operation type, address or such is stored in the command queue 93. Depending on the connected memory module, for example a conventional one with one address/command address and control connection or a DIMM with two address and control connections, the queue 93 is split into a number of logical queues. For example in FIGS. 1 and 2, there are two queues required because of the two groups G1, G2. In the present case of splitting, a request distributor can control into which of the two logical queues it is put.

If data is received with the command, the ECC 97 can compute an error correction code and data is put into one part of the data buffer dependent on the configuration. Then, the data is formatted according to the number of data wires on the memory bus 70.

The memory protocol state machine scheduler 92 creates the signals on the address and control lines, either for one or for two groups of memory chips on the DIMM, for example. If there are two, it operates as two independent state machines. The detailed operations, e.g. bank open/close, precharge, etc., are transmitted over the memory bus 70 by means of the line driver 91 which guarantees the right electrical properties, for instance with respect to termination.

For example, data wires are terminated by the memory controller 60 on a read operation, but by the memory chip 21-24 on a write operation. Address lines are terminated on the DIMM 10, in particular outside the memory chips 21-24. For the present memory controller 60, this is configurable, i.e. the disabling of the termination necessary for data lines on a read operation is only used, when the wire on the memory bus 70 is used as a data wire and not as an address and control connection.

Figure 7:
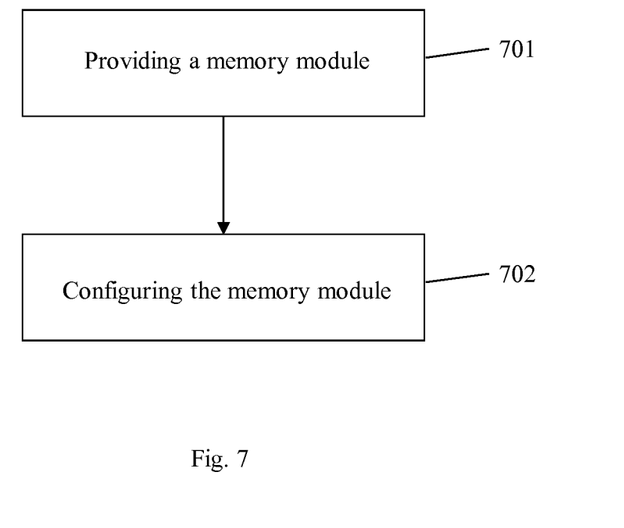
FIG. 7 shows a first embodiment of a sequence of method steps for controlling a memory module.

Furthermore, FIG. 7 shows an embodiment of a sequence of method steps for controlling a memory module. In step 701, a memory module is provided which comprises a plurality of memory chips and a plurality of connections for connecting the memory module to a processor.

In step 702, the memory module is configured such that a part of the connections is grouped into N sets of address and control connections for N separatively controllable groups of memory chips of the plurality of memory chips (N≥2).

Figure 8:
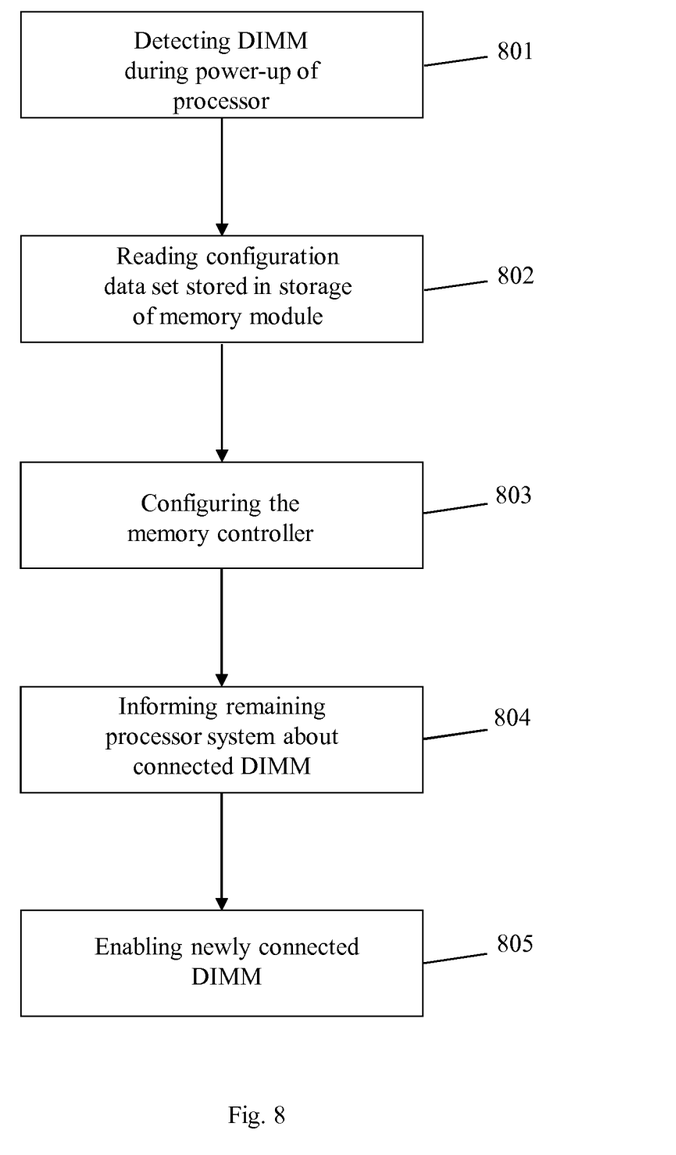
FIG. 8 shows a second embodiment of a sequence of method steps for controlling a memory module.

FIG. 8 shows a second embodiment of a sequence of method steps for controlling a memory module, for example a DIMM, which includes a plurality of memory chips and a plurality of connections for connecting the memory module to the processor. The memory module can be embodied as shown in FIG. 1 or 2.

In step 801, a newly connected DIMM is detected during power-up of the processor. In step 802, the configuration data set stored in the storage 40 of the memory module is read to the configurator of the memory controller.

In step 803, the memory controller and particularly the memory module are configured. Said step 803 particularly includes setting the line driver, setting a defined number of active state machines, setting the queue organization of the command queue, setting the first data formatter 95 and the second data formatter 96.

In step 804, the remaining processor system is informed about the actual connected DIMM. In step 805, the newly connected DIMM is enabled. Thus, the configuration procedure is completed.

Computerized devices can be suitably designed for implementing embodiments of the present invention as described herein. In that respect, it can be appreciated that the methods described herein are largely non-interactive and automated. In exemplary embodiments, the methods described herein can be implemented either in an interactive, partly-interactive or non-interactive system. The methods described herein can be implemented in software (e.g., firmware), hardware, or a combination thereof. In exemplary embodiments, the methods described herein are implemented in software, as an executable program, the latter executed by suitable digital processing devices. In further exemplary embodiments, at least one step or all steps of above method for FIG. 7 or 8 can be implemented in software, as an executable program, the latter executed by suitable digital processing devices. More generally, embodiments of the present invention can be implemented wherein general-purpose digital computers, such as personal computers, workstations, etc., are used.

Figure 9:
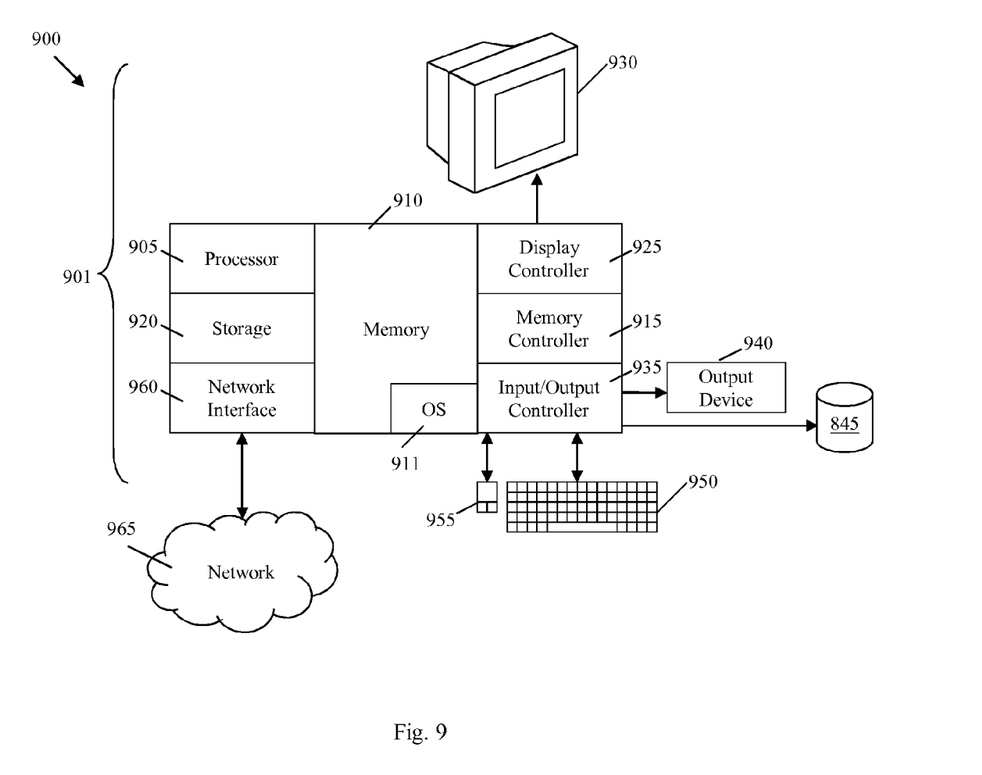
FIG. 9 shows a schematic block diagram of an embodiment of a system adapted for controlling a memory module.

For instance, the system 900 depicted in FIG. 9 schematically represents a computerized unit 901, e.g., a general-purpose computer. In exemplary embodiments, in terms of hardware architecture, as shown in FIG. 9, the unit 901 includes a processor 905, memory 910 coupled to a memory controller 915, and one or more input and/or output (I/O) devices 940, 945, 950, 955 (or peripherals) that are communicatively coupled via a local input/output controller 935. The input/output controller 935 can be, but is not limited to, one or more buses or other wired or wireless connections, as is known in the art. The input/output controller 935 can have additional elements, which are omitted for simplicity, such as controllers, buffers (caches), drivers, repeaters, and receivers, to enable communications. Further, the local interface can include address, control, and/or data connections to enable appropriate communications among the aforementioned components. For example, the memory 910 can be embodied by the memory module 10 of FIG. 1 or 2. Moreover, the memory controller 915 can be embodied by the memory controller 60 of FIG. 6.

The processor 905 is a hardware device for executing software, particularly that stored in memory 910. The processor 905 can be any custom made or commercially available processor, a central processing unit (CPU), an auxiliary processor among several processors associated with the computer 901, a semiconductor based microprocessor (in the form of a microchip or chip set), or generally any device for executing software instructions.

The memory 910 can include any one or combination of volatile memory elements (e.g., random access memory) and nonvolatile memory elements. Moreover, the memory 910 can incorporate electronic, magnetic, optical, and/or other types of storage media. Note that the memory 910 can have a distributed architecture, where various components are situated remote from one another, but can be accessed by the processor 905.

The software in memory 910 can include one or more separate programs, each of which comprises an ordered listing of executable instructions for implementing logical functions. In the example of FIG. 9, the software in the memory 910 includes methods described herein in accordance with exemplary embodiments and a suitable operating system (OS) 911. The OS 911 essentially controls the execution of other computer programs, such as the methods as described herein (e.g., FIG. 7 or 8), and provides scheduling, input-output control, file and data management, memory management, and communication control and related services.

The methods described herein can be in the form of a source program, executable program (object code), script, or any other entity comprising a set of instructions to be performed. When in a source program form, then the program needs to be translated via a compiler, assembler, interpreter, or the like, as known per se, which can or cannot be included within the memory 910, so as to operate properly in connection with the OS 911. Furthermore, the methods can be written as an object oriented programming language, which has classes of data and methods, or a procedure programming language, which has routines, subroutines, and/or functions.

Possibly, a conventional keyboard 950 and mouse 955 can be coupled to the input/output controller 935. Other I/O devices 940-955 can include sensors (especially in the case of network elements), i.e., hardware devices that produce a measurable response to a change in a physical condition like temperature or pressure (physical data to be monitored). Typically, the analog signal produced by the sensors is digitized by an analog-to-digital converter and sent to controllers 935 for further processing. Sensor nodes are ideally small, consume low energy, are autonomous and operate unattended.

In addition, the I/O devices 940-955 can further include devices that communicate both inputs and outputs. The system 900 can further include a display controller 925 coupled to a display 930. In exemplary embodiments, the system 900 can further include a network interface or transceiver 960 for coupling to a network 965.

The network 965 transmits and receives data between the unit 901 and external systems. The network 965 is possibly implemented in a wireless fashion, e.g., using wireless protocols and technologies, such as WiFi, WiMax, etc. The network 965 can be a fixed wireless network, a wireless local area network (LAN), a wireless wide area network (WAN) a personal area network (PAN), a virtual private network (VPN), intranet or other suitable network system and includes equipment for receiving and transmitting signals.

The network 965 can also be an IP-based network for communication between the unit 901 and any external server, client and the like via a broadband connection. In exemplary embodiments, network 965 can be a managed IP network administered by a service provider. Besides, the network 965 can be a packet-switched network such as a LAN, WAN, Internet network, etc.

If the unit 901 is a PC, workstation, intelligent device or the like, the software in the memory 910 can further include a basic input output system (BIOS). The BIOS is stored in ROM so that the BIOS can be executed when the computer 901 is activated.

When the unit 901 is in operation, the processor 905 is configured to execute software stored within the memory 910, to communicate data to and from the memory 910, and to generally control operations of the computer 901 pursuant to the software. The methods described herein and the OS 911, in whole or in part are read by the processor 905, typically buffered within the processor 905, and then executed. When the methods described herein (e.g. with reference to FIG. 7 or 8) are implemented in software, the methods can be stored on any computer readable medium, such as storage 920, for use by or in connection with any computer related system or method.

As will be appreciated by one skilled in the art, aspects of the present invention can be embodied as a system, method or computer program product. Accordingly, aspects of the present invention can take the form of an entirely hardware embodiment, an entirely software embodiment (including firmware, resident software, micro-code, etc.) or an embodiment combining software and hardware aspects. Furthermore, aspects of the present invention can take the form of a computer program product embodied in one or more computer readable medium(s) having computer readable program code embodied thereon. Any combination of one or more computer readable medium(s) can be utilized.

The computer readable medium can be a computer readable signal medium or a computer readable storage medium. A computer readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium can include the following: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium can be any tangible medium that can contain, or store a program for use by or in connection with an instruction execution system, apparatus, or device.

A computer readable signal medium can include a propagated data signal with computer readable program code embodied therein, for example, in baseband or as part of a carrier wave. Such a propagated signal can take any of a variety of forms, including, but not limited to, electromagnetic, optical, or any suitable combination thereof. A computer readable signal medium can be any computer readable medium that is not a computer readable storage medium and that can communicate, propagate, or transport a program for use by or in connection with an instruction execution system, apparatus, or device.

Program code embodied on a computer readable medium can be transmitted using any appropriate medium, including but not limited to wireless, wireline, optical fiber cable, RF, etc., or any suitable combination of the foregoing. Computer program code for carrying out operations for aspects of the present invention can be written in any combination of one or more programming languages, including an object oriented programming language such as Java, Smalltalk, C++ or the like and conventional procedural programming languages, such as the "C" programming language or similar programming languages. The program code can execute entirely on the unit 901, partly thereon, partly on a unit 901 and another unit 901, similar or not.

Aspects of the present invention are described above with reference to flowchart illustrations and/or block diagrams of methods, apparatus (systems) and computer program products according to embodiments of the invention. It will be understood that each block of the flowchart illustrations and/or block diagrams can be implemented by one or more computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions can also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams can represent a module, segment, or portion of code, which comprises one or more executable instructions for implementing the specified logical function(s). It should also be noted that, in some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved and algorithm optimization. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

More generally, while the present invention has been described with reference to certain embodiments, it will be understood by those skilled in the art that various changes can be made and equivalents can be substituted without departing from the scope of the present invention. In addition, many modifications can be made to adapt a particular situation to the teachings of the present invention without departing from its scope. Therefore, it is intended that the present invention not be limited to the particular embodiments disclosed, but that the present invention will include all embodiments falling within the scope of the appended claims.

We claim:

1. A memory system, comprising:
   a memory module including a plurality of memory chips and
   a plurality of connections for connecting the memory module to a processor, wherein a part of the plurality of connections is configurable to be grouped into N number of sets of address and control connections for N number of separately controllable groups of memory chips of the plurality of memory chips, N ≥2,
   wherein the plurality of connections for connecting the memory module to the processor is configurable such that a ratio of address transfers to data transfers of the memory module is changeable;
   a memory controller configured to receive requests from a command queue and to broadcast commands directly to the N number of separately controllable groups of memory chips, wherein the command queue is split into N number of logical queues corresponding to the N number of separately controllable groups of memory chips in a 1:1 manner; and
   a request distributor for controlling into which of the N number of logical queues to store request information.

2. The memory module of claim 1, wherein said part of the plurality of connections is configurable such that each set of the N number of sets of address and control connections is connectable to a respective group of the N number of separately controllable groups of memory chips.

3. The memory module of claim 2, further comprising:
   a storage for storing a number of sets of configuration data for configuring the plurality of connections.

4. The memory module of claim 3, wherein the storage is configured to provide one selected set of configuration data of the number of sets of configuration data to the memory controller for configuring the memory module by the selected set configuration data.

5. The memory module of claim 3, wherein each set of configuration data of the number of sets of configuration data includes a group indication indicating the number of groups in the N number of separately controllable groups of memory chips, a member indication for each group of the N number of separately controllable groups of memory chips, the member indication indicating the memory chips of each group in the N number of separately and controllable groups of memory chips, and a capacity indication for each group of the N number of separately controllable groups of memory chips, the capacity indication indicating a capacity of the memory chips of each group in the N number separatively controllable groups of memory chips.

6. The memory module of claim 5, wherein each set of configuration data further includes timing information for the N number of separately controllable groups of memory chips, power supply information, latency information or requirements for refresh.

7. The memory module of claim 1, wherein the plurality of connections includes one data connection for each memory chip of the plurality of memory chips.

8. The memory module of claim 3, wherein the storage is an EEPROM storage.

9. The memory module of claim 1, wherein the memory module is a Dual In-Line Memory Module (DIMM).

10. A memory controller for controlling a memory module having a plurality of memory chips and a plurality of connections for connecting the memory module to a processor, the memory controller comprising:
   a configurator for configuring the memory module such that a part of the plurality of connections is grouped into N number of sets of address and control connections for N number of separately controllable groups of memory chips of the plurality of memory chips, N≥2,
   wherein the configurator changes a ratio of address transfers to data transfers of the memory module,
   wherein the memory controller is configured to receive requests from a command queue, and to broadcast commands directly to the N number of separately controllable groups of memory chips in a 1:1 manner, and
   wherein the command queue is split into N number of logical queues corresponding to the N number of separately controllable groups of memory chips; and
   a request distributor for controlling into which of the N number of logical queues to store request information.

11. The memory controller of claim 10, further comprising:
   a receiver for receiving one selected set of configuration data of a number of sets of configuration data stored in a storage of the memory module for configuring the plurality of connections, wherein the configurator is adapted to configure the plurality of connections based on the received selected set of configuration data of the number of sets of configuration data.

12. The memory controller of claim 11, further comprising:
   a selector for transmitting a request to the memory module for selecting one set of configuration data of the number of sets of configuration data stored in the storage of the memory module for configuring the plurality of connections.

13. The memory controller of claim 11, wherein the configurator is further adapted to configure a line driver for driving the plurality of connections, a memory protocol state machine scheduler for controlling the line driver and the command queue for inputting address and control data to the memory protocol state machine scheduler based on the received selected set of configuration data of the number of sets of configuration data.

14. The memory controller of claim 11, wherein the configurator is further adapted to configure a first data formatter for formatting data to be transmitted between the memory module and the processor within each group of the N number of separately controllable groups of memory chips and a second data formatter for formatting data between the N number of separately controllable groups of memory chips.

15. A system comprising:
   a memory module comprising a plurality of memory chips, a plurality of connections for connecting the memory module to a processor, wherein a part of the plurality of connections is configurable to be grouped into N number of sets of address and control connections for N number of separately controllable groups of memory chips of the plurality of memory chips, N≥2,
   wherein the plurality of connections for connecting the memory module to the processor is configurable such that a ratio of address transfers to data transfers of the memory module is changeable;
   a memory controller comprising a configurator for configuring the memory module such that the part of the plurality of connections is grouped into the N number sets of address and control connections for the N number of separately controllable groups of memory chips of the plurality of memory chips,
   wherein the memory controller is configured to receive requests from a command queue, and to broadcast commands directly to the N number of separately controllable groups of memory chips, and
   wherein the command queue is split into N number of logical queues corresponding to the N number of selectively controllable groups of memory chips in a 1:1 manner; and
   a request distributor for controlling into which of the N number of logical queues to store request information.

16. The system of claim 15, further comprising:
   a receiver for receiving one selected set of configuration data of a number of sets of configuration data stored in a storage of the memory module for configuring the plurality of connections, wherein the configurator is adapted to configure the plurality of connections based on the received selected set of configuration data of the number of sets of configuration data.

17. The system of claim 15, further comprising:
   a selector for transmitting a request to the memory module for selecting one set of configuration data of the number of sets of configuration data stored in the storage of the memory module for configuring the plurality of connections.

18. The system of claim 15, wherein the configurator is further adapted to configure a line driver for driving the plurality of connections, a memory protocol state machine scheduler for controlling the line driver and the command queue for inputting address and control data to the memory protocol state machine scheduler based on the received selected set of configuration data of the number of sets of configuration data.

19. The system of claim 15, wherein the configurator is further adapted to configure a first data formatter for formatting data to be transmitted between the memory module and the processor within each group of the N number of separately controllable groups of memory chips and a second data formatter for formatting data between the N number of separately controllable groups of memory chips.

20. The system of claim 15, wherein the plurality of connections includes one data connection for each memory chip of the plurality of memory chips.

\* \* \* \* \*